United States Patent
Satake et al.

(10) Patent No.: US 8,102,191 B2
(45) Date of Patent: Jan. 24, 2012

(54) WINDOW COMPARATOR CIRCUIT FOR LIMITING INPUT VOLTAGE APPLIED TO OBJECT CIRCUIT

(75) Inventors: Hiroyuki Satake, Oogaki (JP); Takeshi Miki, Okazaki (JP)

(73) Assignee: Denso Corporation, Kariya (JP)

( * ) Notice: Subject to any disclaimer, the term of this patent is extended or adjusted under 35 U.S.C. 154(b) by 216 days.

(21) Appl. No.: 12/692,097

(22) Filed: Jan. 22, 2010

(65) Prior Publication Data

US 2010/0188789 A1 Jul. 29, 2010

(30) Foreign Application Priority Data

Jan. 23, 2009 (JP) ................................ 2009-012952

(51) Int. Cl.
*H03K 5/153* (2006.01)
*H02H 3/00* (2006.01)
(52) U.S. Cl. ............................... 327/74; 327/77; 361/88
(58) Field of Classification Search .................... 327/74, 327/77

See application file for complete search history.

(56) References Cited

U.S. PATENT DOCUMENTS

| | | | | |
|---|---|---|---|---|
| 4,061,932 A * | 12/1977 | Cordell | ........................... | 327/74 |
| 4,611,136 A * | 9/1986 | Fujie | ............................ | 327/262 |
| 5,224,007 A | 6/1993 | Gill, Jr. | | |
| 5,963,062 A * | 10/1999 | Fujii | ............................. | 327/74 |
| 2008/0001606 A1* | 1/2008 | Kojima | ........................ | 324/537 |

FOREIGN PATENT DOCUMENTS

| | | |
|---|---|---|
| JP | 57-040657 | 3/1982 |
| JP | 62-101118 | 5/1987 |
| JP | 04-315729 | 11/1992 |
| JP | 10-123182 | 5/1998 |
| JP | 2004-301709 | 10/2004 |
| JP | 2008-170285 | 7/2008 |

* cited by examiner

*Primary Examiner* — Dharti Patel
(74) *Attorney, Agent, or Firm* — Nixon & Vanderhye PC

(57) ABSTRACT

Plurality of current mirror circuits CM1 to CM5 at which the same amount of current I1 flows in the circuits. Transistors Qa4/Qb5 are ON state when it is in the steady state. Transistors Qa5/Qb7 turn ON and transistors Qb6/Qa6 turn OFF when a voltage generation circuit 3 applies a voltage more than predetermined value V12 to node N3. Therefore node N3 becomes fixed voltage V12. On the other hand, voltage generation circuit 3 applies a voltage less than predetermined value V23 to node N3, transistors Qb5/Qa6 turn ON, and transistors Qa5/Qb7 turn OFF. Accordingly, the node N3 becomes fixed voltage V23.

10 Claims, 8 Drawing Sheets

1: WINDOW COMPARATOR CIRCUIT
4: REFERENCE VOLTAGE GENERATION BLOCK
N0: FIRST POWER SOURCE NODE
GND: SECOND POWER SOURCE NODE
Qa4: FIRST TRANSISTOR
Qb5: SECOND TRANSISTOR
Qa5: THIRD TRANSISTOR
Qb6: FORTH TRANSISTOR

WINDOW COMPARATOR CIRCUIT FOR LIMITING INPUT VOLTAGE APPLIED TO OBJECT CIRCUIT

CROSS-REFERENCE TO RELATED APPLICATION

This application is related to Japanese Patent Application NO. 2009-12952 filed on Jan. 23, 2009, the contents of which are hereby incorporated by reference.

BACKGROUND OF THE INVENTION

1. Field of the Invention

The present invention relates to a comparator circuit used for a protection circuit, more particular to a window comparator circuit to is protect an object circuit to be protected from an excessively high or low input voltage.

2. Description of the Related Art

A type of window comparator circuit has been known as a circuit which is used for protecting an object circuit (hereinafter referred to a protected circuit) suffering from excessively high or low input voltage. For instance, Japanese Patent Laid-open Publication Number JP-1982-40657 discloses a circuit configuration comprising two comparator circuits and resistors which are connected in series to generate two reference voltages, each reference voltage is applied to either a non-inverting input terminal or an inverting input terminal of the two comparators. The output terminals of the comparators are configured as open collector circuits and are pulled up with resistors. In this configuration, the input voltage is inputted to a non-inverting input terminal and an inverting input terminal of the two comparators and the input voltage is compared with the two reference voltages so as to limit the input voltage being exceed an upper limit voltage and a lower limit voltage. In addition, patent documents, Japanese Patent Laid-open Publication Number JP-2004-301709 and JP-2008-170285 can be listed as related arts of the present invention.

In the document of the Japanese patent laid open number JP-1982-40657, operational amplifiers (hereinafter referred to op-amp) have been used in order to limit the input voltage being exceed the upper voltage limit and the under voltage limit. However, an op-amp circuit employs approximately 20 transistors so that the circuit scale will be increased. Since the technical features of the JP-2004-301709 and JP-2008-170285 include using a large number of op-amp circuits, similar problem arises as well as the document S57-40567.

SUMMARY OF THE INVENTION

The present invention has been made in light of the problem mentioned above, and has as its object to provide a window comparator circuit which is able to shrink its circuit scale having an equivalent function as the related art.

According to a first aspect of the present invention, following effects can be achieved. A reference voltage generation block generates first and second reference voltages on the basis of a voltage applied between a first power supply node and a second power supply node. A first transistor having a first control terminal is connected to a portion between the first power source node and the second power source node as a diode-connection. Also, the first transistor is connected to a first node at which a first current is supplied by a first current source. At the first node, the first reference voltage is applied. On the other hand, a second transistor having a second control terminal is connected to a portion between the first power source node and the second power source node as a diode-connection. Also, the second transistor is connected to a second node at which a second current is supplied by a second current source. At the second node, the second reference voltage is applied.

A third transistor has a third control terminal and outputs the first reference voltage from a first output terminal when a voltage between the third control terminal and the first output terminal becomes a predetermined voltage or more. A fourth transistor has a fourth control terminal and outputs the second reference voltage from a second output terminal which is tied together with the first output terminal when a voltage between the fourth control terminal and the second output terminal becomes a predetermined voltage or more. Thus, a limited voltage is inputted to the protected circuit. In this case, the first transistor or the fourth transistor mainly behaves as a voltage limiting operation.

Conventionally, for instance, it is required to employ at least 20 is or more transistors if the circuit is configured to be used as an op-amp. In contrast, according to the first aspect of the present invention, the first or fourth transistor mainly contributes the circuit operation. Hence, the circuit scale for protecting the protected circuit suffering from excessively high or low input voltage can be significantly reduced. Also, similar voltage limiting function can be implemented by the circuit configuration as well as the related art described above.

According to a second aspect of the present invention, the reference voltage generation block constitutes a plurality of the resistors that are connected in series between the first power source node and the second power source node. Therefore, the first and second reference voltage can be changed easily by adjusting the value of the plurality of resistors. As a result, a voltage limiting range for the input voltage of the protected circuit can be adjusted easily.

DESCRIPTION OF THE PREFERRED EMBODIMENTS

With reference to the accompanying drawings, hereinafter will be described embodiments of the present invention.

First Embodiment

Figure 1:
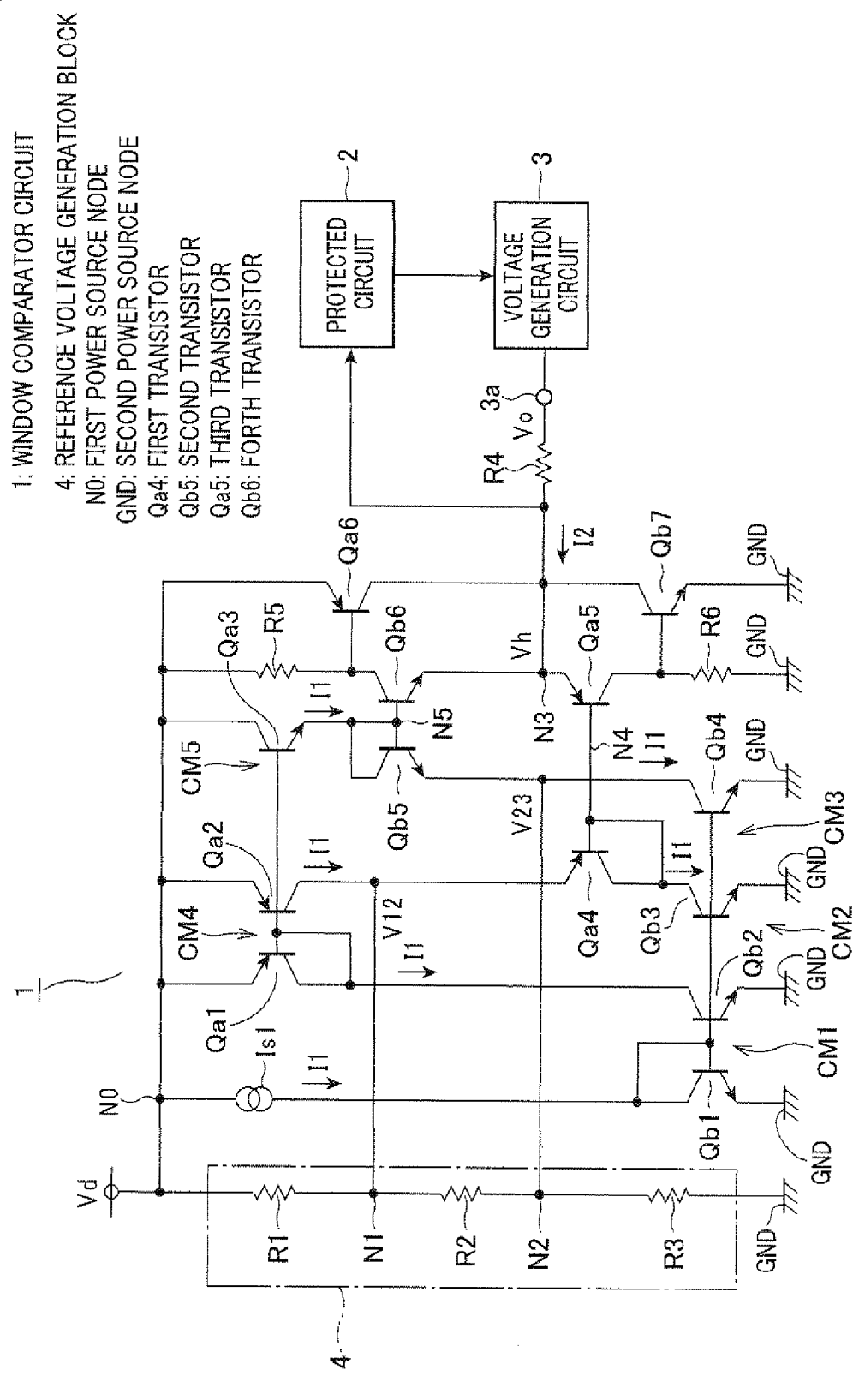
FIG. 1 is a circuit diagram showing an electrical configuration according to the first embodiment of the present invention.

Hereinafter will be described the first embodiment with reference to FIGS. 1 to 5. FIG. 1 illustrates a circuit diagram showing a configuration of a window comparator circuit. As shown in the FIG. 1, the window comparator circuit 1 is configured to protect an input of a protected circuit 2 suffering from an excessively high or low input voltage. The protected circuit 2 includes a circuit having limited input voltage range. For example, the protected circuit 2 comprises a sensor circuit that operates when a necessary input voltage is applied. Regarding a voltage generation circuit 3, for instance, the circuit 3 generates a feedback voltage based on the output voltage of the sensor circuit provided in the protected circuit 2 and constitutes a feedback circuit such that the output voltage of the voltage generation circuit 3 shows over voltage when an output signal of the sensor circuit exceeds predetermined upper side voltage range and shows under voltage when the output signal of the sensor circuit becomes below predetermined lower side voltage range. Accordingly, an unexpected abnormal operation on the protected circuit 2 might occur when the input voltage of the protected circuit 2 becomes out of predetermined voltage range. For this reason, the first embodiment provides the Window comparator circuit 1. The window comparator circuit according to the present invention will be used for various sensor circuits which is mounted on a vehicle system such as sensors used for air/fuel ratio (i.e., A/F ratio) detecting unit or the like.

The window comparator circuit 1 comprises a current source Is1, PNP type bi-polar junction transistors (hereinafter referred to as transistor) Qa1 to Qa6, NPN type bi-polar junction transistors (hereinafter referred to as transistor) Qb1 to Qb7 and resistors R1 to R3. In addition, R4 is connected to an input side of the circuit. The resistor 4 is arranged at a portion between an output terminal 3a of voltage generation circuit 3 and the protected circuit 2.

A power supply voltage Vd (e.g. 5V) is supplied to a power source node N0 (i.e., corresponds to a first power source node) and the resistors R1 to R3 are connected in series between the power source node N0 and the ground GND (i.e., corresponds to a second power source node). In the embodiment, a single power supply circuit is used. However, a configuration of a dual power supply may be used.

A reference voltage generation circuit 4 serving as a reference voltage generation block comprises the resistors R1 to R3. The reference voltage generation circuit 4 generates divided voltages corresponding to values of R1 to R3 and supplies the divided voltages to a node N1 and a node N2, where the N1 is a common node at which R1 and R2 are connected and the N2 is a common node at which R2 and R3 are connected. The current source Is1 and the transistor Qb1 that forms a diode connection are connected in series between the power source node N0 and the ground GND.

The base terminal of the transistor Qb1 and base terminals of the transistors Qb2 to Qb4 are connected together. Among these transistors, current mirror circuits CM1, CM2 and CM3 are formed by the transistors Qb1 and Qb2, the transistors Qb1 and Qb3, and the transistors Qb1 and Qb4, respectively. The emitter terminals of the transistors Qb1 to Qb4 are connected to the GND. Each mirror ratio of the CM1 to CM3 corresponding to the transistor pairs of the Qb1-Qb2, the Qb1-Qb3 and the Qb1-Qb4 are designed as 1:1.

With regard to the transistor Qa1, the emitter terminal is connected to the power source node N0 and the base and the collector terminals are tied together. Also, the collector terminal of the Qa1 and the collector terminal of the Qb2 are tied together. The base terminal of the Qa1 is connected to the both base terminals of the Qa2 and Qa3. The emitter terminals of the transistors Qa2 and Qa3 are connected to the power source node N0.

The collector terminal of the transistor Qa2 is connected to the node N1. Also, the emitter terminal of the transistor Qa4 is connected to the node N1. The base terminal and collector terminal of the transistor Qa4 are tied together and the collector terminal of Qa4 is connected to the collector terminal of the Qb3.

The emitter terminal of the transistor Qa3 is connected to the power source node N0. The collector terminal of the transistor Qa3 is connected to the base terminal and collector terminal of the Qb5. The emitter terminal of the Qb5 is connected to the node N2. Also node N2 is connected to the collector terminal of the transistor Qb4. A current mirror circuit CM4 is formed by the transistors Qa1 and Qa2 and a current mirror circuit CM5 is formed by the transistors Qa1 and Qa3. Each mirror ratio of the CM4 and CM5 corresponding to the transistor pairs of Qa1-Qa2 and Qa1-Qa3 are designed as 1:1.

In the transistors Qb5 and Qb6, base terminals are tied together. With respect to the power source node N0, the emitter terminal of the transistor Qa6 and one end of the resistor R5 are connected to the node N0. The other end of the resistor 5 is connected to the collector terminal of transistor Qb6 and base terminal of the transistor Qa6. The emitter terminal of the transistor Qb6 is connected to the emitter terminal of transistor Qa5. Hereinafter will be described a node N3 at which the emitter terminal of transistor Qb6 and the emitter terminal of the transistor Qa5 are connected together. The base terminal of the transistor Qa4 and the base terminal of the Qa5 are tied together.

The collector terminal of the transistor Qa5 is connected to the is base terminal of the transistor Qb7 and connected to the one end of the resistor R6. The other end of the resistor R6 is connected the ground GND. Therefore, the resistor R5, the collector-emitter of the Qb6, the emitter-collector of the Qa5 and the resistor R6 are connected in series between the power source node N0 and the ground GND. Each resistor R5 and R6 has a resistor value e.g. several kΩ and the resistor values of R5 and R6 may be selected as the same value in order to keep a symmetric characteristic of the circuit.

The emitter-collector of transistor Qa6 and the collector-emitter of the transistor Qb7 are connected in series between the power source node N0 and the ground GND. These transistors Qb6 and Qb7 are connected at the common node N3. Also, the node N3 acts as a node for the input terminal of the protected circuit 2. In addition, the node N3 is connected to the output terminal of the voltage generation circuit 3 via the resistor R4.

Figure 2:
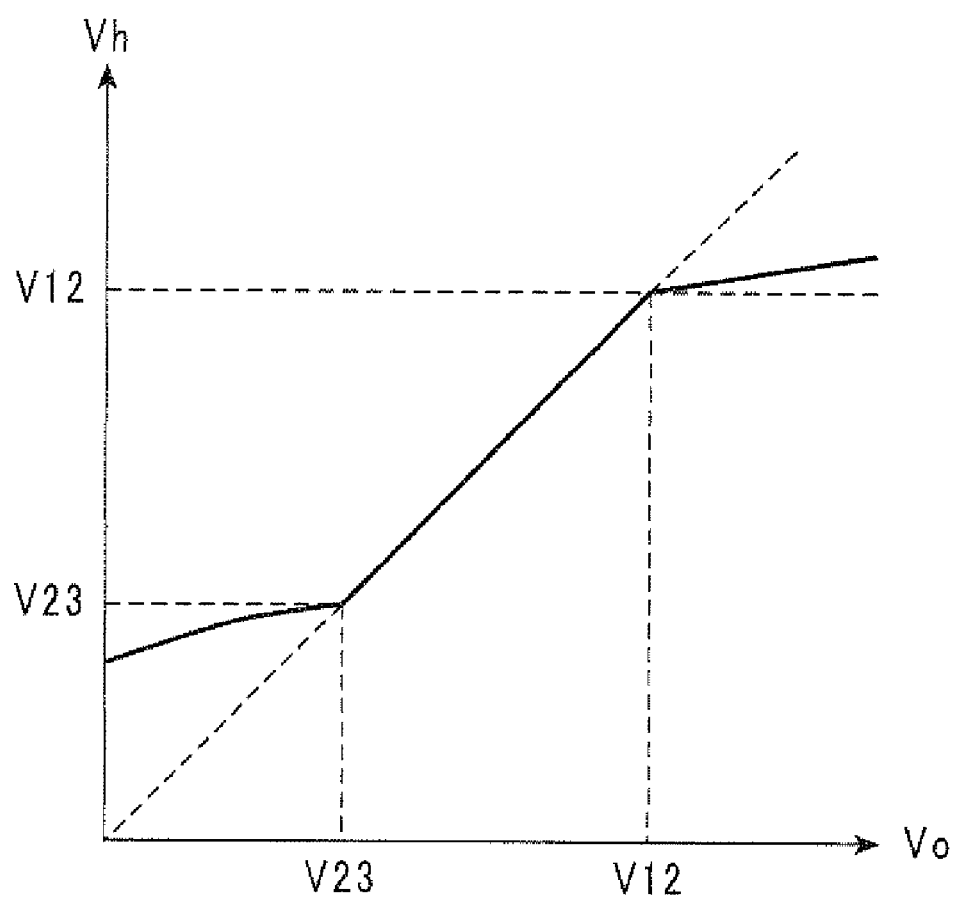
FIG. 2 is a graph showing an input voltage characteristic of a protected circuit.

Hereinafter will be described effects of the circuit configuration as described above. FIG. 2 roughly illustrates a voltage characteristic of the window comparator circuit when the window comparator circuit protects the input voltage of the protected circuit. With reference to the FIG. 2, a bias condition of the window comparator circuit when the circuit is in the steady state will be explained as follows.

As shown in FIG. 2, in the window comparator circuit 1, theoretically, the voltage Vh is limited (i.e., protected) to a predetermined voltage range (i.e., ranges from V23 that is a voltage at the node N2 to V12 which is a voltage at the node N1) against the dc (i.e., direct current) voltage V0 that is an output voltage from the voltage generation circuit 3. The window comparator circuit 1 is configured such that in the predetermined voltage range as described above, the voltage V0 is applied to the protected circuit 2 without any changes and the voltage V23 is applied to the protected circuit 2 when the voltage V0 is in a range less than the voltage V23 at the node N2, is similarly, the voltage V12 is applied to the protected circuit 2 when the voltage V0 is in a range more than the voltage V12 at the node N1. Also, the window comparator circuit 1 protects the node N3 such that a voltage V0 exceeding the predetermined voltage range is not directly applied to the N3 with a path from the voltage generation circuit 3 to the node N3 via the resistor R4.

When a steady current is flowing from the current source Is1 via the transistor Qb1, the same amount of current as a current I1 that is flowing through the current source Is1 flows as a collector current of the transistors Qb2, Qb3, and Qb4.

Due to the circuit configuration, a current value flowing through the collector of the transistor Qb2 is equivalent to the value of the current flowing through the transistor Qa1. Since the transistors Qa1 and Qa2 work as the current mirror circuit CM2 of which mirror ratio is 1:1, value of the collector current of the transistor Qa2 is equivalent to the current I1. In addition, the collector current of the transistor Qb3 is equivalent to the current I1. Therefore, the collector current I1 of the transistor Qa2 flows to the transistor Q4 via the node N1. Theoretically, the current from the transistor Qa4 does not flow on the resistor R2 and R3 via the node N1. Since the current I1 is always flowing through the transistor Qa4, the transistor Qa4 remains ON state.

Similarly, the collector current of the transistor Qa3 and the collector current of the transistor Qb4 are equivalent to the current so that the current I1 flows through the transistor Qb5. However, the current I1 does not flow through the resistor R3 via the node N2. The current I1 is always applied on the transistor Qb5 whereby the transistor Qb5 remains ON state. Such a bias conditions are made in the window comparator circuit 1.

Figure 3:
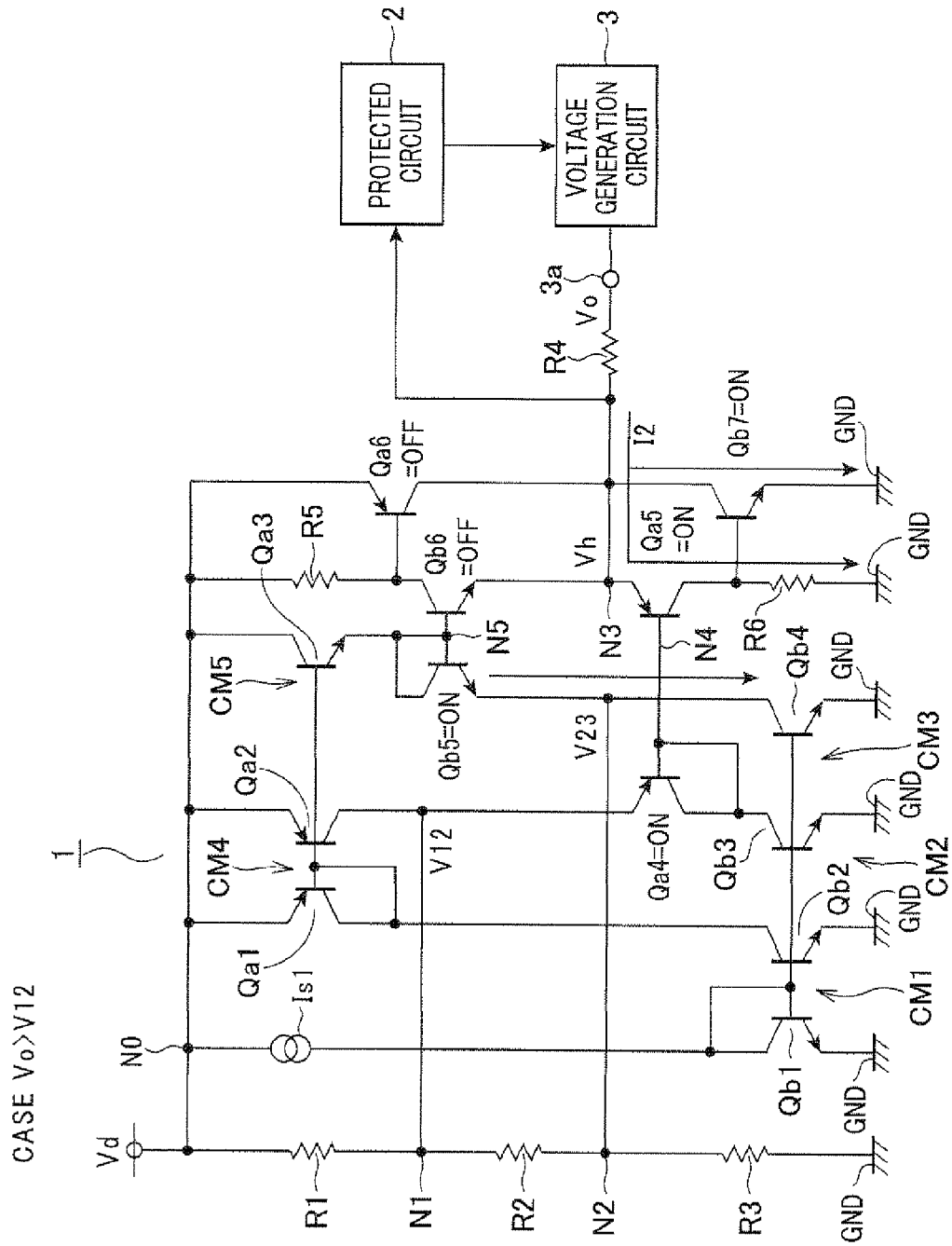
FIG. 3 is a circuit diagram showing a state of the current flowing when the output voltage of a voltage generating circuit is in higher voltage range.

FIG. 3 roughly illustrates the ON/OFF states of the transistors when the input voltage Vh (i.e., the voltage at the node N3) of the protected circuit 2 satisfies a voltage condition V12<Vo. In the steady state as described above, the transistors Qa4 and Qb5 stay ON state. The voltage at the node N4 at which both of the base terminals of the transistors Qa4 and Qa5 are connected each other, becomes a voltage that is decreased from the voltage V12 at the node N1 by the base-emitter voltage of Qa4. Therefore, the transistor Qa5 turns ON when the voltage at the node N3 increases from the voltage at the node N4 by the voltage between the base and emitter terminal of the transistor Qa5.

Assuming the base-emitter voltages (i.e., Vbe) of the Qa4 and Qa5 are the same voltage, if the voltage N3 increases more than the voltage at the node N1, the transistor Qa5 sink the current to the resistor R6. Hence, the voltage at the node N3 becomes the same voltage as the voltage V12 at the node N1. As a result, the voltage at the node N3 does not exceed the voltage V12. If the current more than a predetermined value flows through the resistor R6, the base-emitter voltage of the transistor Qa7 increases and therefore, transistor Qb7 turns ON state.

As described above, in the steady state, the transistor Qb5 is always in the ON state so that the voltage of the node N5 at which the bases of the transistors Qb5 and Qb6 are connected each other, becomes a voltage increased from the voltage at the node N2 by the base-emitter voltage Vbe of Qb5. Accordingly, when the voltage at the node N3 exceeds the voltage V12, the voltage between the node N5 and the node N3 does not become the saturation voltage of the transistor Qb6 when the Qb6 is ON. For instance, the transistor Qb6 becomes OFF state and also the transistor Qa6 becomes OFF state.

Figure 4:
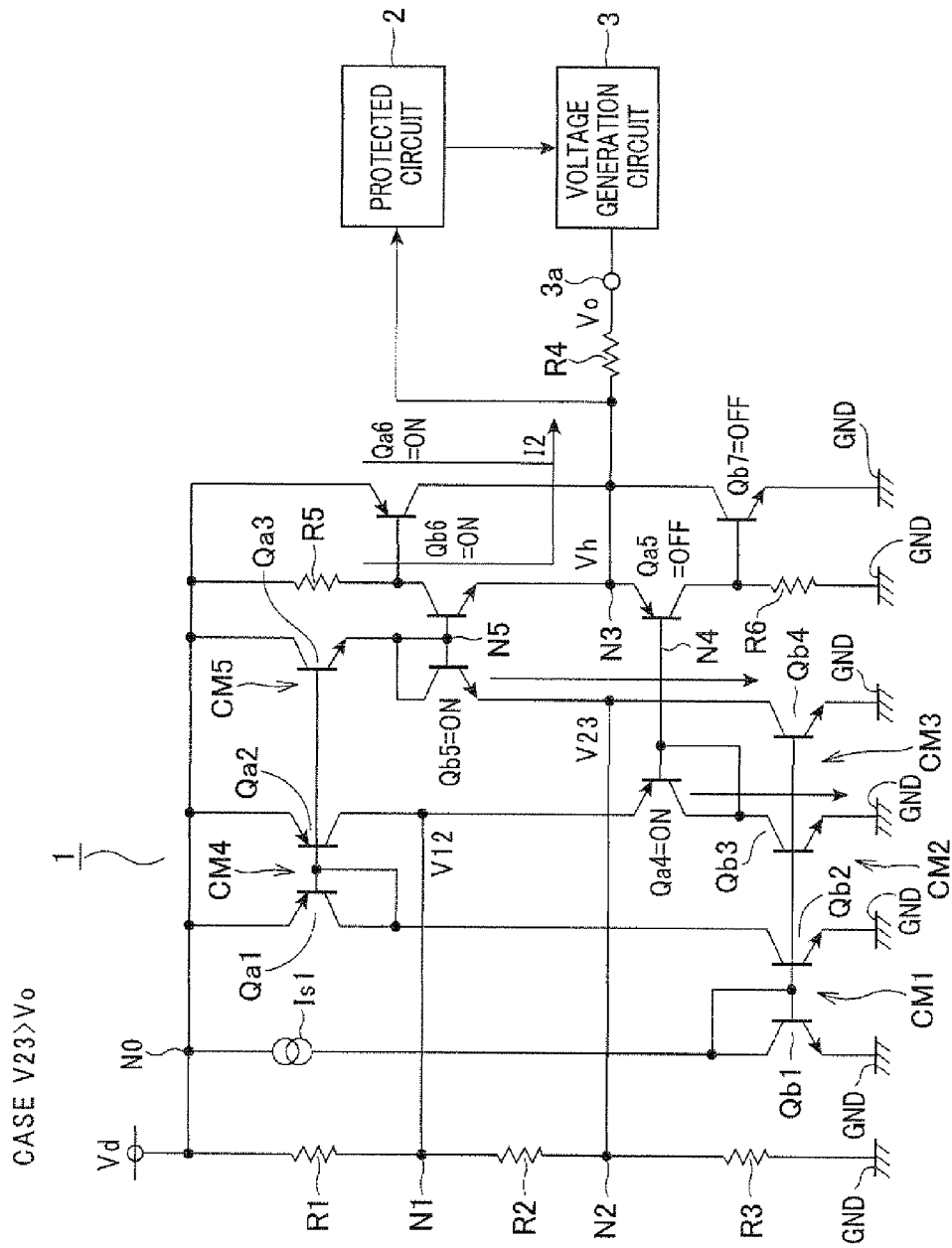
FIG. 4 is a circuit diagram showing a state of the current flowing when the output voltage of the voltage generating circuit is in lower to voltage range.

FIG. 4 roughly illustrates the ON/OFF states of the each transistor when the input voltage Vh (i.e., voltage at the node N3) of the protected circuit 2 satisfies a voltage condition V23>Vo. As described above, in the steady state, the transistors Qa4 and Qb5 stay ON state. Regarding the voltage at the node N5 at which the bases of the transistors Qb5 and Qb6 are connected each other, becomes a voltage increased from the voltage at the node N2 by the base-emitter voltage Vbe of Qb5. Therefore, when the voltage at the node N3 is decreased from the voltage at the node N5 by the base-emitter voltage Vbe of transistor Qb6, the transistor Qb6 turns ON.

Assuming the base-emitter voltages (i.e., Vbe) of the Qb5 and Qb6 are the same voltage, if the voltage N3 decreases less than the voltage at the node N2, the current start to flow through the resistor R5 via the transistor Qb6. Therefore, the voltage at the node N3 becomes the same voltage as the V23 at the node N2 and never becomes a voltage lower than the voltage V23. When the current flows through the resistor R5 of which current value is more than a predetermined value, then the base-emitter voltage of the transistor Qa6 increases. As a result, the transistor Qa6 turns ON.

As described above, in the steady state, the transistor Qa4 turns ON. Hence, the voltage at the node N4 at which the bases of the transistors Qa4 and Qa5 are connected each other, becomes a voltage decreased from the voltage at the node N1 by the base-emitter voltage. When the voltage at the node N3 is lower than the voltage V23, the voltage between the node N3 and the node N4 does not reach the saturation voltage in the ON state of the transistor Qa5 and for instance, the transistor Qa5 turns OFF. Therefore, the transistor Qb7 turns OFF as well.

Figure 5:
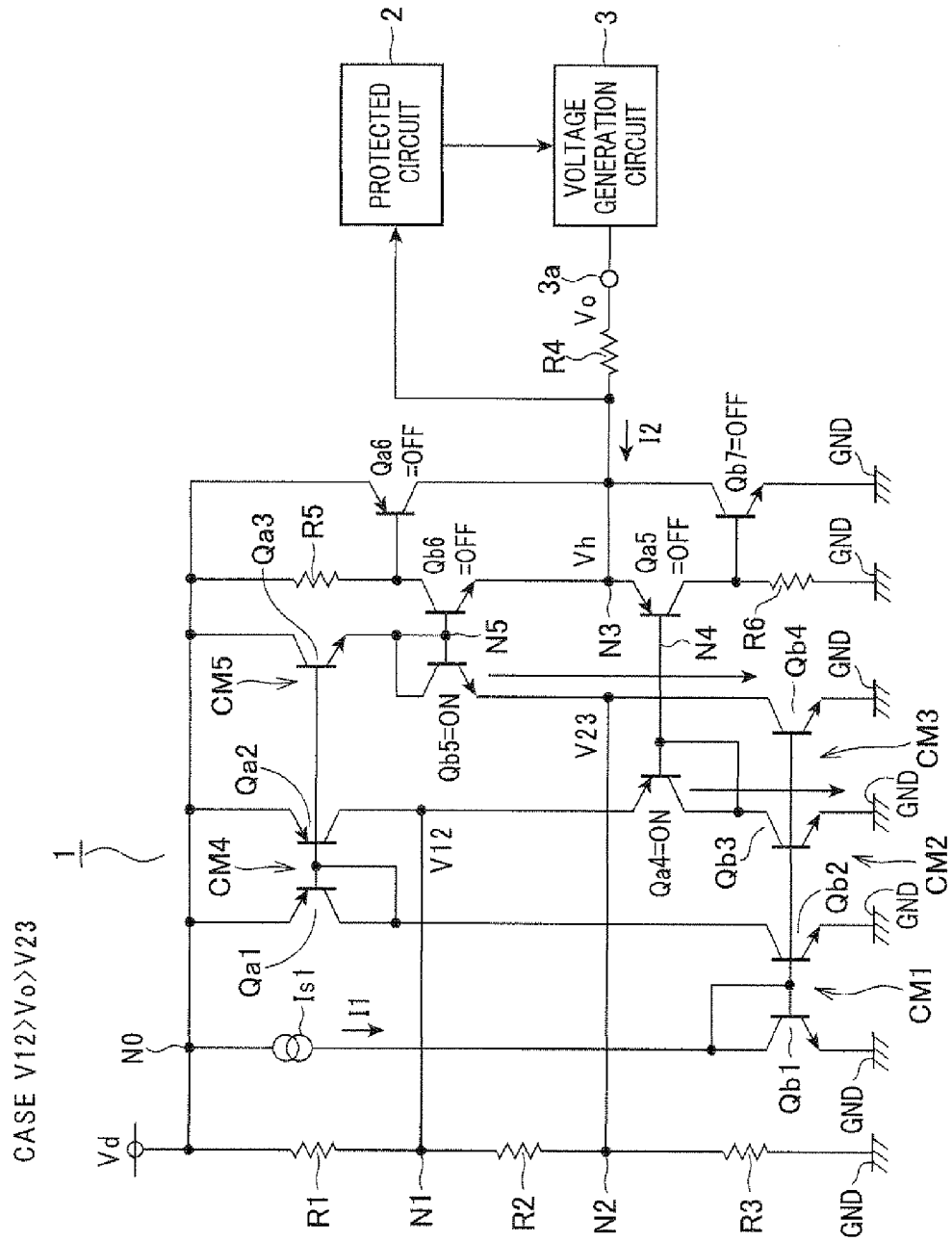
FIG. 5 is a circuit diagram showing a state of the current flowing when the output voltage of the voltage generating circuit is in intermediate voltage range.

FIG. 5 roughly illustrates state of the each transistor when the input voltage Vh (i.e., voltage at the node N3) of the protected circuit 2 satisfies a voltage condition; V12>Vo>V23. As shown in FIG. 5, when the voltage Vh satisfies the condition V12>Vo>V23, the voltage between the node N5 and the node N3 becomes a voltage lower than the base-emitter voltage Vbe of the transistor Qb6. Therefore, the transistor Qb6 turns OFF. Also, the voltage between the node N4 and the node N3 becomes a voltage lower than the base-emitter voltage Vbe of the transistor Qa5 so that the transistor Qa5 turn OFF. Then, the voltages between both ends of the resistors R5 and R6 become 0V. Therefore, the transistors Qa6 and Qb7 turn OFF.

Accordingly, since the current does not flow into the window comparator circuit 1 via the node N3, the output voltage V0 of the voltage generation circuit 3 is directly applied to the protected circuit 2.

As described above, according to the first embodiment of the present invention, significant effects can be produced as follows. The reference voltage generation circuit 4 generates the reference voltage V12 and the reference voltage 23 based on the power supply voltage Vd (e.g. 5V) being supplied to the power source node N0. The reference voltage V12 and the reference V23 are applied to the node N1 and the node N2 respectively. The current mirror circuit CM4 and CM5 supplies the same current as the I1 being supplied by the current source Is1 and the current mirror circuit CM1 to CM3 sink the same current as I1 being supplied by the current source Is1.

The emitter terminal of the transistor Qa4 is connected to the node N1 at which the resistors R1 and R2 are connected each other and the emitter terminal of the transistor Qb5 is connected to the node N2 at which the resistors R1 and R2 are connected each other. However, as described above, the identical current flows through the current mirror circuits CM1 to CM5. Accordingly, no current exchange take place between the reference voltage generation circuit 4 and the current mirror circuit CM1 to CM3.

The emitter terminal of the transistor Qa4 is connected to the node N1 and the current I1 is flowing between the emitter-collector terminals of the transistor Qa4. Hence, the circuit is in the steady state, the transistor Qa4 turns ON. On the other hand, the emitter terminal of the transistor Qb5 is connected to the node N2 and the current I1 is flowing between the emitter-collector terminals of the transistor Qb5. Accordingly, the transistor Qb5 turns on when the circuit is in the steady state.

When the voltage generation circuit 3 applies a voltage higher than the voltage 12 to the node N3, the transistors Qa5 and Qb7 turn ON at the same time and the transistors Qb6 and Qa6 turn OFF as well. Therefore, the voltage at the node N3 is held with the voltage V12 theoretically. Reversely, when the voltage generation circuit 3 applies a voltage lower than the voltage V23 to the node N3, the transistor Qb6 and Qa6 turn ON at the same time and the transistors Qa5 and Qb7 turn OFF as well. Therefore, the voltage of the node N3 is held to the voltage 23 theoretically. Thus, the voltages can be restricted to a certain value.

The four transistors Qb5, Qb6, Qa4 and Qa5 are provided to contribute for a primary operation in this embodiment, with these transistors, the voltages can be restricted in a predetermined voltage range. Accordingly, unlike the circuits described as related arts (i.e., S57-40567, JP-2004-301709 and JP-2008-170285), it is not necessary to employ plurality of op-amp circuits in the embodiment of the present invention. Generally, an op-amp circuit comprises 20 or more transistors so that the number of transistors can be significantly reduced. Therefore, the circuit size can be shrunk.

Moreover, the window comparator circuit 1 can be formed in a semiconductor integrated circuit (IC) where the area (volume) occupied by the window comparator circuit 1 can be reduced even with the same circuit configuration as the prior art.

Also, it is only required to adjust resistor values for resistors R1, R2 and R3 in order to change the divided voltage V12 at the node N1 as an upper limit voltage and the divided voltage V23 at the node N2 as a lower limit voltage.

Second Embodiment

Figure 6:
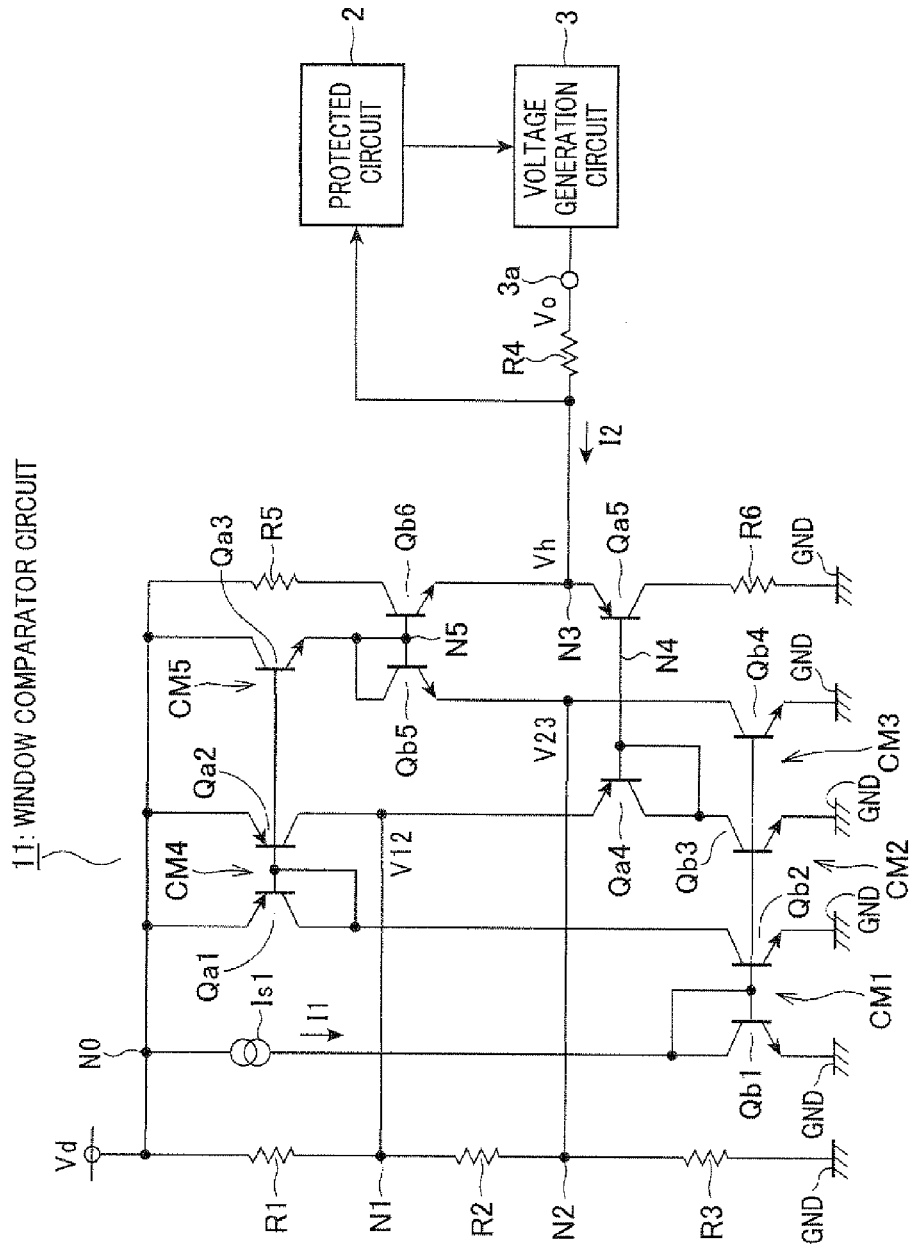
FIG. 6 is a circuit diagram corresponding to the FIG. 1 according to the second embodiment of the present invention.

FIG. 6 illustrates a second embodiment of the present invention. In the second embodiment, a configuration of the output stage of the window comparator 1 is changed from the configuration of the first embodiment. In particular, the second embodiment provides a configuration of the window comparator circuit when the sink current being flow into the window comparator circuit is lower than the configuration of the first embodiment.

As shown in FIG. 6, a window comparator circuit 11 which is the alternative circuit of the window comparator circuit 1, provides a circuit configuration of the output stage circuit being arranged from the output stage of the window comparator 1 such that the transistor Qa6 and Qb7 are removed from the window comparator circuit 1. Since the window comparator circuit 1 according to the first embodiment is capable of sinking high current, when the output current of the voltage generation circuit 3 is high, the circuit configuration of the first embodiment may be used.

In the window comparator circuit 11, the resistor value of the R4 is relatively high. Therefore, it is suitable to use the circuit configuration of the second embodiment when the current I2 flowing in the window comparator circuit 11 is relatively low. In this embodiment, similar advantages as the first embodiment can be achieved even if the transistors Qa6 and Qa7 are removed from the circuit configuration.

Third Embodiment

Figure 7:
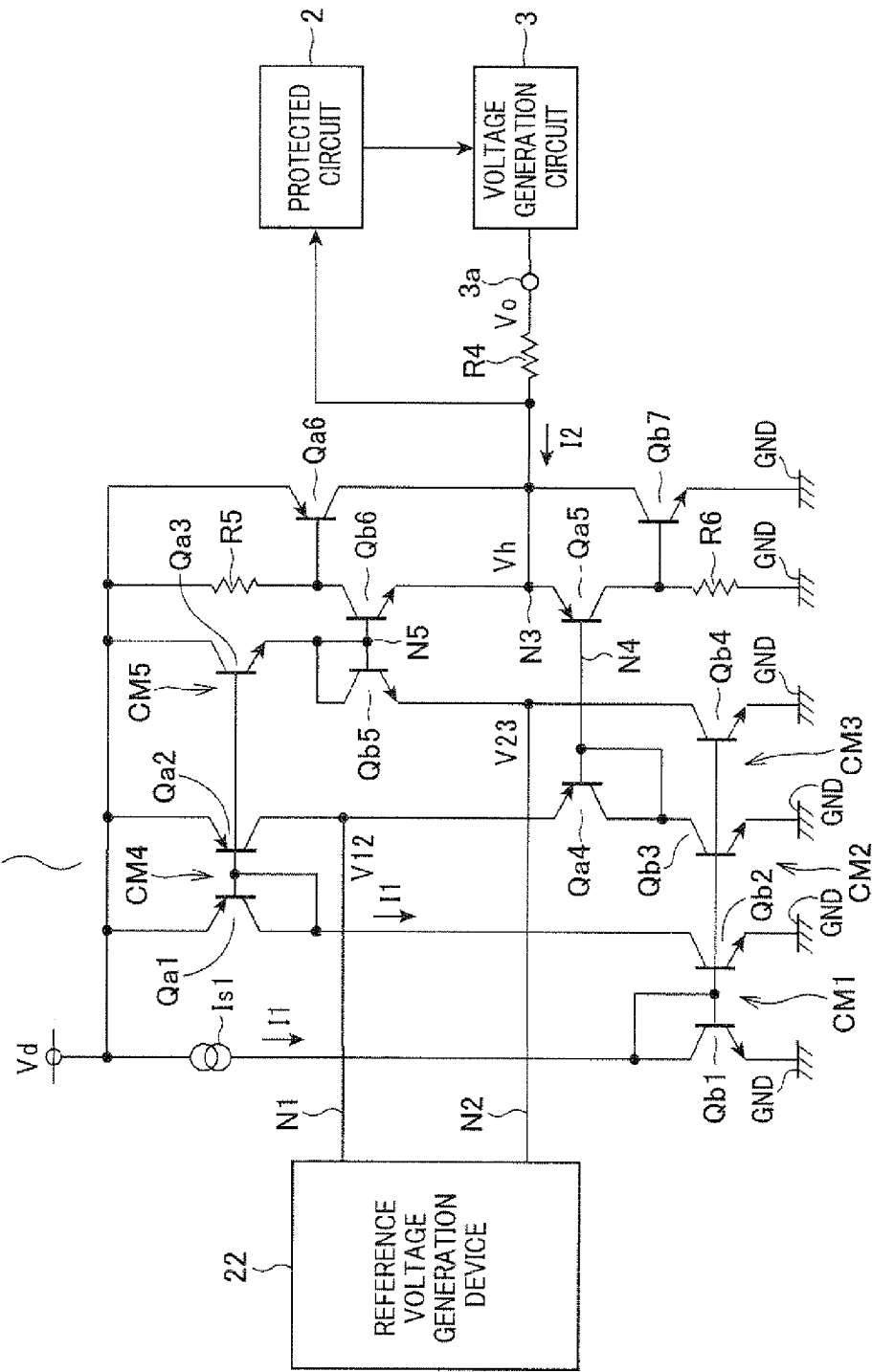
FIG. 7 is a circuit diagram corresponding to the FIG. 1 according to the third embodiment of the present invention.

FIG. 7 illustrates a third embodiment in which a reference voltage generation device newly added as an alternative circuit of the voltage divide circuit consisting of the resistors R1 to R3 used in the configurations of the embodiments as described above. Specifically, the window comparator circuit 21 which is alternative circuit of the window comparator circuit 1 includes a reference voltage generation circuit 22 instead of the voltage divide circuit consisting of the resistors R1 to R3. In the window comparator circuit 21, the reference voltage generation circuit 22 generates a reference voltage V12 which is applied to the node N1 and also generates the reference voltage V23 which is applied to the node N2. Thus, the another circuit configuration without using the resistors R1 to R3 can provide similar advantages as well as the embodiments 1 to 2 as described above. Moreover, the reference voltage generation device can be a semiconductor integrated circuit device which is arranged apart from the window comparator circuit. The device supplies the reference voltages to the window comparator circuit 21 externally.

Fourth Embodiment

Figure 8:
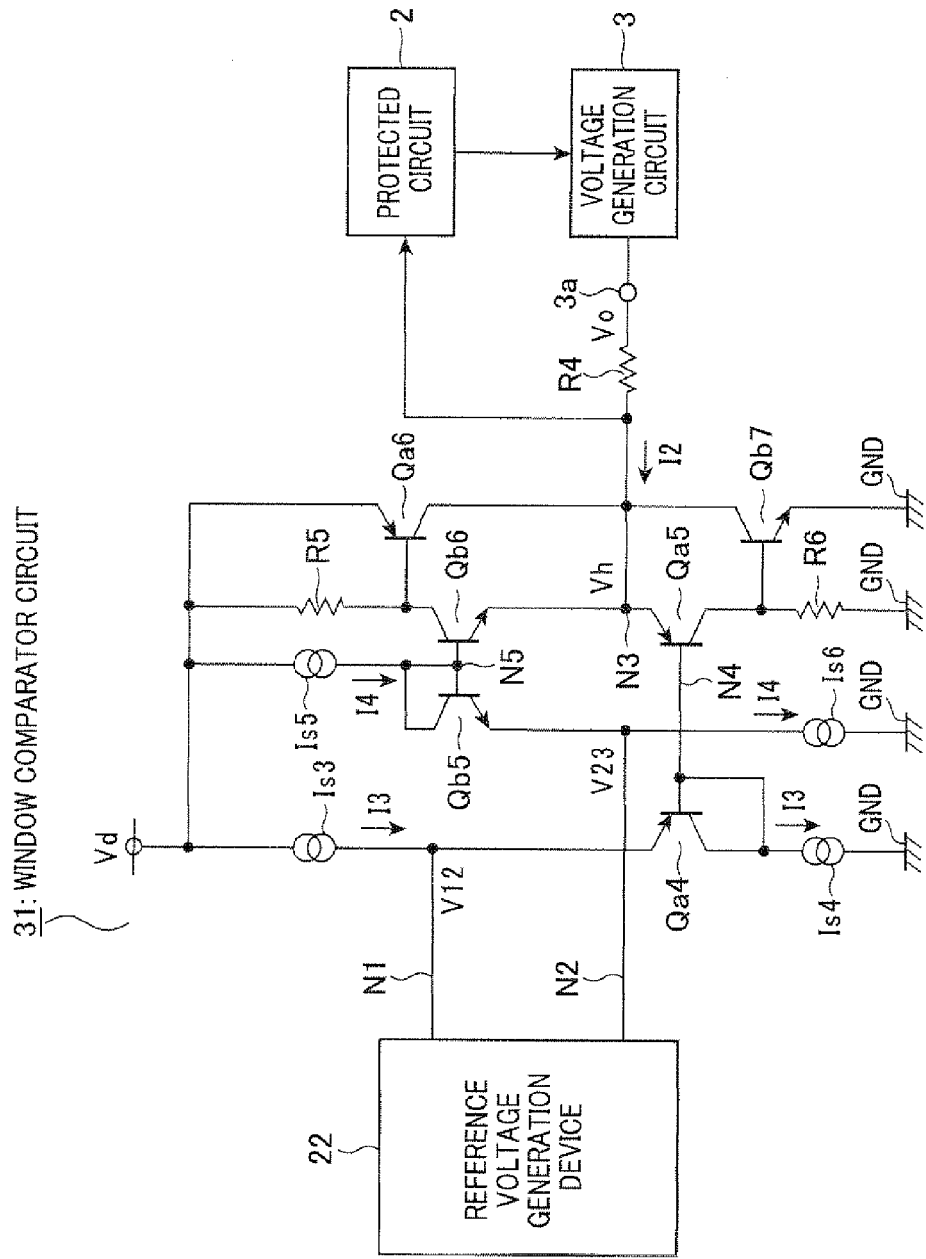
FIG. 8 is a circuit diagram corresponding to the FIG. 1 according to the fourth embodiment of the present invention.

FIG. 8 illustrates a fourth embodiment of the present invention in which another current mirror circuits are used instead of the current mirror circuits of the configurations in the embodiments 1 to 3 as described above. Portions indicating the same configuration as previously described embodiments 1 to 3 have been marked with the same symbols and the explanation thereof are omitted. Hereinafter will be described the portions differs from the embodiments 1 to 3.

FIG. 8 illustrates a window comparator circuit being applied another type of current source. As shown in FIG. 8, a window comparator circuit 31 as an alternative circuit of the window comparator circuit 1 does not include the current mirror circuits CM1 to CM5, instead of these circuits, the window comparator circuit 31 includes current source circuits Is3 to Is6. The current source Is3 is connected to a portion between the power source node N0 and the node N1. The current source Is4 is connected to a portion between the collector terminal of the transistor Qa4 (i.e., node N4) and the ground GND. The current values for the current source Is3 and Is4 are designed to use the same amount of the current I3. Hence, the current source Is4 sink whole amount of the current supplied by the current source Is3.

The current source Is5 is connected to a portion between the power source node N0 and the collector terminal of the transistor Qb5 (i.e., node N5). The current source Is6 is connected to a portion between the emitter terminal of the transistor Qb5 (i.e., node N2) and the ground GND. The current values for the current source Is5 and Is6 are designed to use the same amount of the current I4. Hence, the current source Is6 sink whole amount of the current supplied by the current source Is5. Therefore, the circuit configuration according to this is embodiment, the voltage V12 at the node N1 indicates a constant voltage and also the voltage V23 of the node N2 indicates a constant voltage. As a result, similar advantages as described in the embodiments 1 to 3 can be achieved in this embodiment.

Other Embodiment

The present invention is not limited to the above-described embodiments. Accordingly, following various embodiments or extendable embodiments may be applied. Above-described embodiments are applied for circuits which operate with a DC (direct current) input voltage signal. However, embodiments that protect the circuits suffering from over/under AC (alternate current) signal can be applied if the each transistor satisfies a required speed of response.

The embodiments as described above use a feedback circuit configuration in which a feedback voltage is applied to the protected circuit 2 from the protected circuit 2 via the voltage generation circuit 3 in order to protect the protected circuit 2 suffering from the over/under input voltage. However, a circuit configuration without using the feedback circuit configuration may be applied.

What is claimed is:

1. A window comparator circuit comprising:
  a reference voltage generating block for generating a first reference voltage and a second reference voltage based on a voltage being applied to a portion between a first power supply node and second power supply node;
  a first transistor having a first control terminal, providing a diode-connection between the first power supply node and the second power supply node, and being connected to a first node at which a first current is supplied by a first current source, wherein the first node is connected to a node at which the first reference voltage generated by the reference voltage generation block appears;
  a second transistor having a second control terminal, providing a diode-connection between the first power supply node and the second is power supply node, and being connected to a second node at which a second current is supplied by a second current source, wherein the second node is connected to a node at which the second reference voltage generated by the reference voltage generation block appears;
  a third transistor having a third control terminal that is connected to the first control terminal, having a first output terminal that is connected to an input of a protected circuit, and being connected between the second power source node and the first output terminal, wherein the first reference voltage is outputted on the first output terminal when a voltage between the third control terminal and the first output terminal becomes a predetermined voltage or a voltage more than the predetermined voltage; and
  a fourth transistor having a fourth control terminal that is connected to the second control terminal, having a second output terminal which is connected to the input of the protected circuit and the first output terminal, and being connected between the first power source node and the second output terminal, wherein the second reference voltage is outputted on the second output terminal when a voltage between the fourth control terminal and the second output terminal becomes a predetermined voltage or a voltage more than the predetermined voltage.

2. The window comparator circuit according to claim 1, wherein the reference voltage generation block comprises a plurality of resistors that are connected in series between the first power source node and the second power source node.

3. The window comparator circuit according to claim 1, wherein the window comparator circuit is integrated in a semiconductor integrated circuit.

4. The window comparator circuit according to claim 1, wherein the reference voltage generation block is integrated in a semiconductor integrated circuit.

5. The window comparator circuit according to claim 1, wherein the protected circuit includes a sensor that is mounted on a vehicle.

6. A voltage clamping circuit comprising:
  a power supply having a first power supply node and a second power supply, and supplying power to the voltage clamping circuit at the first power supply node with respect to the second power supply node;
  a first transistor which has a first control terminal, which provides a diode-connection between the first power supply node and the second power supply node, and which is connected to a first node at which a first current is supplied by a first current source, wherein the first node is connected to a node at which a first reference voltage is supplied externally;
  a second transistor which has a second control terminal, which provides a diode-connection between the first power supply node and the second power supply node, and which is connected to a second node at which a second current is supplied by a second current source, wherein the second node is connected to a node at which a second reference voltage is supplied externally;
  a third transistor having a third control terminal that is connected to the first control terminal, having a first output terminal that is connected to an input of a protected circuit, and being connected between the second power source node and the first output terminal, wherein the first reference voltage is outputted on the first output terminal when a voltage between the third control terminal and the first output terminal becomes a predetermined voltage or a voltage more in than the predetermined voltage; and
  a fourth transistor having a fourth control terminal that is connected to the second control terminal, having a second output terminal which is connected to the input of the protected circuit and the first output terminal, and being connected between the first power source node and the second output terminal, wherein the second reference voltage is outputted on the second output terminal when a voltage between the fourth control terminal and the second output terminal becomes a predetermined voltage or a voltage more than the predetermined voltage.

7. The voltage clamping circuit according to claim 6, wherein the first reference voltage and the second reference voltage are supplied by a reference voltage generation device that is connected externally to the voltage clamping circuit.

8. The voltage clamping circuit according to claim 6, wherein the voltage clamping circuit is integrated in a semiconductor integrated circuit.

9. The voltage clamping circuit according to claim 6, wherein the reference voltage generation device is integrated in a semiconductor integrated circuit.

10. The voltage clamping circuit according to claim 6, wherein the protected circuit includes a sensor that is mounted on a vehicle.

* * * * *